(12) United States Patent
Serizawa et al.

(10) Patent No.: US 6,678,946 B2
(45) Date of Patent: Jan. 20, 2004

(54) METHOD OF MANUFACTURING A CIRCUIT UNIT

(75) Inventors: Yasuyoshi Serizawa, Shizuoka (JP); Kenji Iwasaki, Shizuoka (JP); Minoru Kubota, Shizuoka (JP); Keizo Nishitani, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/987,635

(22) Filed: Nov. 15, 2001

(65) Prior Publication Data

US 2002/0057557 A1 May 16, 2002

(30) Foreign Application Priority Data

Nov. 16, 2000 (JP) ....................... P2000-349745

(51) Int. Cl.[7] .......................... H05K 3/36; H05K 3/34; H01R 9/00
(52) U.S. Cl. ...................... 29/830; 29/840; 29/842; 29/843
(58) Field of Search ................. 228/248.1; 269/47, 269/52, 903; 29/840, 830, 832, 622, 834, 842, 843

(56) References Cited

U.S. PATENT DOCUMENTS

| | | | | |
|---|---|---|---|---|
| 4,231,154 A | * | 11/1980 | Gazdik et al. ............... 257/697 |
| 4,593,804 A | * | 6/1986 | Kinsey et al. ................. 193/41 |
| 4,872,261 A | * | 10/1989 | Sanyal et al. ................ 101/127 |
| 5,046,707 A | * | 9/1991 | Allen .......................... 269/309 |
| 5,383,787 A | * | 1/1995 | Switky et al. ................. 439/67 |
| 5,581,875 A | * | 12/1996 | Hibino et al. ................ 174/255 |
| 5,625,944 A | * | 5/1997 | Werther ....................... 257/697 |
| 5,802,711 A | * | 9/1998 | Card et al. ................ 228/180.1 |
| 5,862,583 A | * | 1/1999 | Ammann et al. .............. 269/47 |
| 5,898,992 A | * | 5/1999 | Annable ....................... 29/840 |
| 5,996,222 A | * | 12/1999 | Shangguan et al. ........... 29/840 |
| 6,020,218 A | * | 2/2000 | Shim et al. .................. 438/111 |
| 6,158,595 A | * | 12/2000 | Wark et al. ............... 211/41.17 |
| 6,455,950 B1 | * | 9/2002 | Nishitani et al. ........... 307/10.1 |
| 2002/0057557 A1 | * | 5/2002 | Serizawa et al. ........... 361/752 |

* cited by examiner

*Primary Examiner*—Carl J. Arbes
*Assistant Examiner*—Thiem D Phan
(74) *Attorney, Agent, or Firm*—Sughrue Mion, PLLC

(57) ABSTRACT

An upper surface of a bottom surface (31) of a lower casing (30), covering a lower surface of an FPC (23), is made flat so as not to hinder a coating operation in which solder paste is coated to the upper surface of the FPC (23) by a squeegee. This lower casing is made of a heat-resistant insulative material, and the lower casing is charged into a solder reflow furnace, with electronic parts (25) attached to the FPC (23).

10 Claims, 4 Drawing Sheets

METHOD OF MANUFACTURING A CIRCUIT UNIT

BACKGROUND OF THE INVENTION

This invention relates to a circuit unit, mounted, for example, on a door panel of a vehicle or the like, and to a method of producing the same, more particularly relates to a circuit unit and a method of producing the same, in which a flexible printed circuit is used as a wiring circuit member on which electronic parts are mounted by soldering, and the flexible printed circuit having the electronic parts mounted thereon is received and held in a casing divided into two (upper and lower) sections, that is, a lower casing and an upper casing.

As power-window circuit units for opening and closing window glass panes of a vehicle, there have been developed various circuit units of the type which are mounted on a door panel, and include a wiring circuit member on which electronic parts are mounted by soldering and a casing which is divided into two (upper and lower) sections, that is, a lower casing and an upper casing, and has the wiring circuit member received and held therein and switches for opening and closing circuit contacts within the casing are provided on an upper surface of the upper casing.

In such a circuit unit, for example, the surface of the upper casing on which the switches are provided is, in many cases, formed into a curved structure in order to enhance the operability of the switches and also to match its design with the interior design. In order to enhance the ability of reception into the casing of a curved structure, the wiring circuit member to be received in the circuit unit is required to have flexibility so that an undue force will not act on this wiring circuit member arranged in conformity with the curved surface with in the casing. In addition to the electric circuits for the power windows, various electric circuits, for example, for adjusting power seats and for controlling courtesy lamps are incorporated in a door panel or the like of the vehicle. Therefore, in order to achieve a high packaging density in a limited space within the door, the wiring circuit member used in the circuit unit is also required to have a space-saving design.

In order to meet these requirements, there have recently been extensively used flexible printed circuits (hereinafter referred to as "FPC") as a wiring circuit member on which electronic parts are mounted by soldering, and this flexible printed circuit has a wiring circuit printed on a film-like or a sheet-like thin flexible insulative substrate.

FIGS. 6A to 6E show the process of producing a related circuit unit using an FPC as a wiring circuit member on which electronic parts are mounted.

The production process shown in here is a process to the step in which the FPC, having the electronic parts mounted thereon, is received and held in a lower casing of the circuit unit.

More specifically, first, the FPC 1 on which the electronic parts are to be mounted is attached in position to an exclusive transport support plate 3, as shown in FIG. 6A. The flat surface 3a of the transport support plate 3 is brought into close contact with the lower surface of the FPC so that the FPC which the electric parts are to be mounted on the upper surface thereof is supported by the transport support plate 3, thereby preventing flexible displacement of the FPC 1 which would invite an erroneous processing during the electronic parts-mounting operation and the solder paste-coating operation. A mold release material is provided on that region of the transport support plate 3, indicate by hatching in the drawings, so that the FPC 1 can be easily separated or peeled therefrom when removing it from this plate at a later step.

Then, the solder paste 6 is coated onto electric part-mounting portions of the upper surface of the FPC 1 by a squeegee 5, as shown in FIG. 6B. The solder paste 6 is coated only to electric part-soldering portions through paste introducing holes 7a formed through a masking member 7 superposed on the upper surface of the FPC 1.

The predetermined electronic parts 9 are attached to the upper surface of the FPC 1 coated with the solder paste 6, and then a holder plate 11 is superposed on the FPC 1 as shown in FIG. 6C, and in this condition the FPC 1 is charged into a solder reflow furnace so as to solder the electronic parts 9.

The holder plate 11 has a window 11a through which that region of the FPC 1 to which the electronic parts are attached (that is, that region where the solder paste 6 is coated) is exposed, and this holder plate holds the non-soldering region in close contact with the transport support plate 3.

The FPC 1, which has been charged into the reflow furnace and the soldering of the electronic parts 9 has been finished, is separated from the transport support plate 3 as shown in FIG. 6D. Then, this FPC is fixed in position to an upper surface of a bottom wall 13a of the lower casing 13 of the circuit unit, as shown in FIG. 6E.

In the above related production method, during the FPC 1 to which the parts have been soldered is separated from the transport support plate 3 as shown in FIG. 6D, a stress is applied to the solder joint portions because of curvature of the FPC 1 or the like, and this leads to a possibility that the electrical and mechanical performance of the solder joint portions is lowered.

Another problem is that the separating operation must be carried out carefully in order to reduce the stress, applied to the solder joint portions due to the curvature of the FPC 1 or the like at the time of separating the FPC 1 from the transport support plate 3, to a minimum, so that the productivity is lowered.

Further, the exclusive transport support plate 3 needs to be designed and produced in accordance with the dimensions of the FPC 1 and so on. Therefore, there has been pointed out a problem that the design cost and production cost of the transport support plate 3 increases the production cost of the circuit unit.

Furthermore, in the above related production method, the FPC 1, on which the electronic parts 9 have been mounted by soldering, is fixed in position to the upper surface of the bottom wall 13a of the lower casing 13 as shown in FIG. 6E. However, that portion of the FPC, on which the electronic parts 9, are mounted, is considerably reduced in flexibility, and besides this portion can not be accidentally pressed in order to reduce the stress, applied to the solder joint portions, to a minimum. As a result, the FPC 1 is mounted on the lower casing 13 in such an unstable condition that part of the parts-mounted portions of the FPC 1 are lifted off the lower casing 13, and when switches and so on are mounted on the FPC 1 through a rubber contact or the like, there is a possibility that the reliability of the operation of the switches is lowered because of the lifting-off of the FPC 1.

SUMMARY OF THE INVENTION

This invention has been made under the above circumstances, and an object of the invention is to provide a circuit unit, as well as a method of producing the same, in which the production cost can be reduced by eliminating the use of an exclusive transfer support plate in a soldering operation and so on, and besides the productivity can be enhanced by eliminating the steps of attaching and detaching an FPC relative to such a transfer support plate, and further the application of stresses to solder joint portions by a handling operation during the production process is considerably reduced, and at the same time the close contact of the FPC with a lower casing is enhanced, thereby enhancing the electrical and mechanical performance of the solder joint portions, and furthermore when switches are mounted on the FPC, the reliability of the operation of the switches can be enhanced.

In order to solve the aforesaid object, the invention is characterized by having the following arrangement.

(1) A circuit unit comprising:
  a flexible printed circuit including a wiring circuit formed on an insulative substrate thereof, an electronic part being mounted on an upper surface thereof;
  a lower casing for holding the flexible printed circuit, including a flat bottom wall for covering a lower surface of the flexible printed circuit, wherein the lower casing is made of a heat-resistant material so that the lower casing can be sent to a solder reflow furnace in a state that the electric parts is mounted on the flexible printed circuit; and
  a upper casing, for covering the flexible printed circuit, including an engagement member through which the upper casing is connected to the lower casing.

(2) The circuit unit according to (1), wherein a lower surface of the bottom wall to which the flexible printed circuit is not mounted includes a reinforcing rib for preventing warp of the lower casing.

(3) The circuit unit according to (2), wherein the reinforcing rib is integrally formed with the lower casing.

(4) The circuit unit according to (1), wherein the upper casing is provided with a switch key top for operating a switch formed on the flexible printed circuit.

(5) A method of manufacturing a circuit unit comprising a flexible printed circuit, a lower casing for holding the flexible printed circuit, and an upper casing, for covering the flexible printed circuit, connectable to the lower casing, the method comprising the steps of:
  putting and fixing the flexible printed circuit on a predetermined flat position of the lower casing;
  mounting an electric part on the flexible printed circuit;
  sending the lower casing, mounting the flexible printed circuit with the electric part, to a solder reflow furnace so that the electric part is soldered to the flexible printed cable; and
  connecting the upper casing to the lower casing.

(6) The method according to (5), wherein in the putting and fixing step, a positioning jig positions the flexible printed circuit on the predetermined flat position by passing projections of the positioning jig through the lower casing and the flexible flat circuit.

DETAILED DESCRIPTION OF PREFERRED EMBODIMENTS

A preferred embodiment of a circuit unit of the present invention, as well as a method of producing this circuit unit, will now be described in detail with reference to the drawings.

Figure 1:
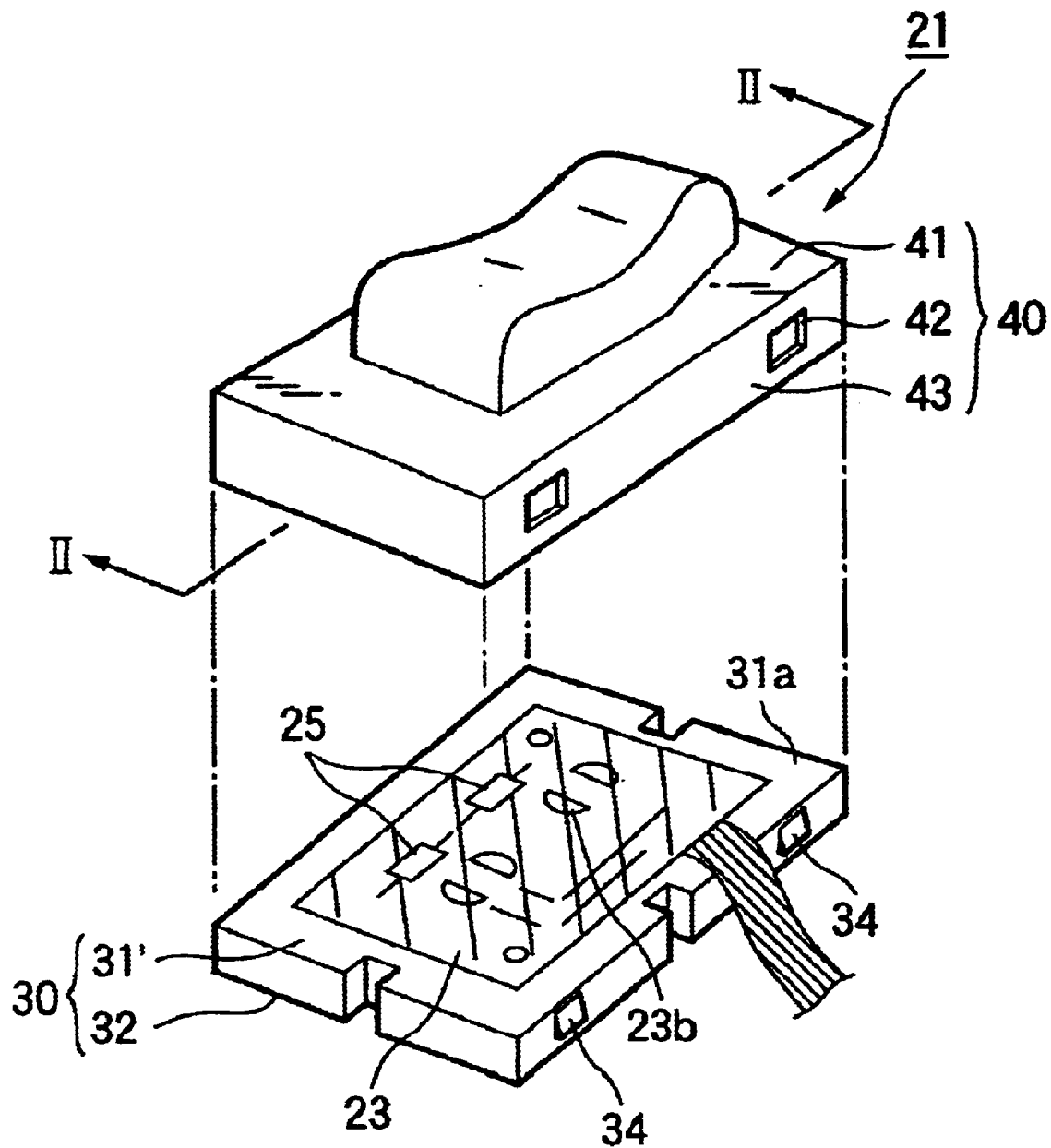
FIG. 1 is an exploded, perspective view showing one preferred embodiment of a circuit unit of the present invention.
Figure 2:
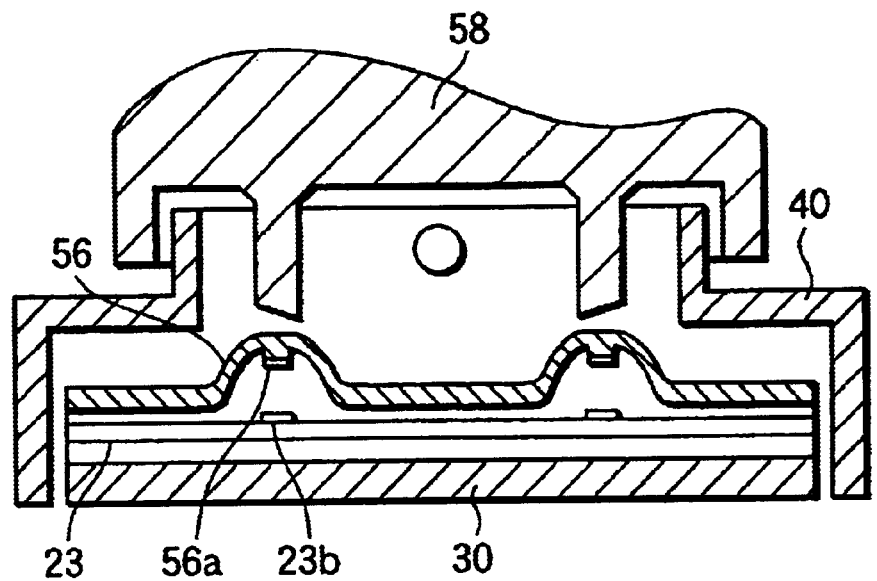
FIG. 2 is a cross-sectional view taken along the line II—II of FIG. 1.
Figure 3:
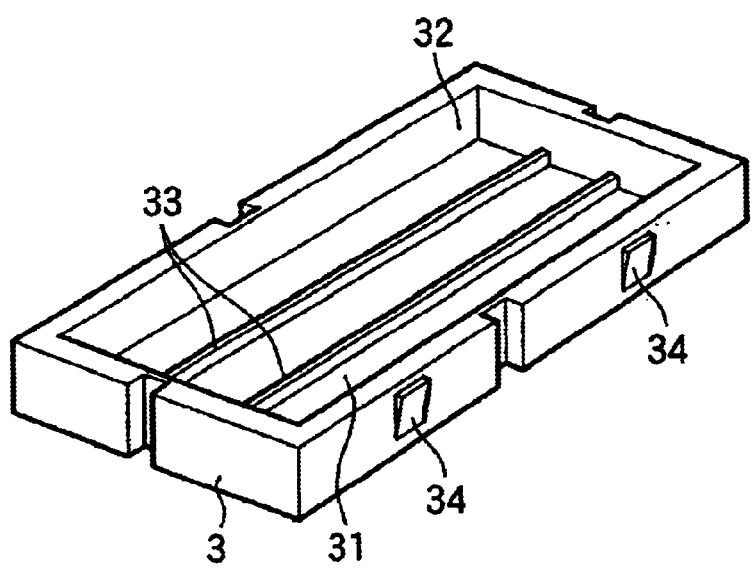
FIG. 3 is a perspective view of a lower casing as seen from a lower side thereof.
Figure 4:
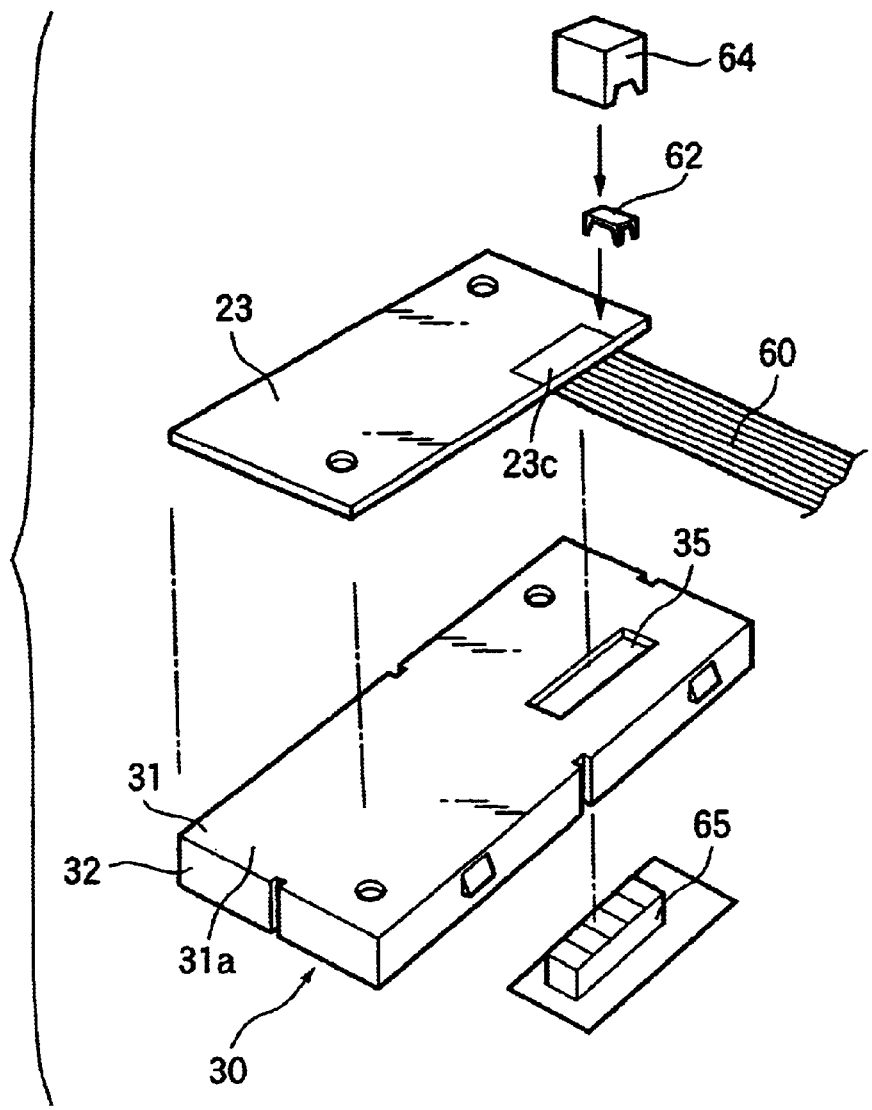
FIG. 4 is an exploded, perspective view, showing the lower casing and a flexible printed circuit shown in FIG. 1.
Figure 5:
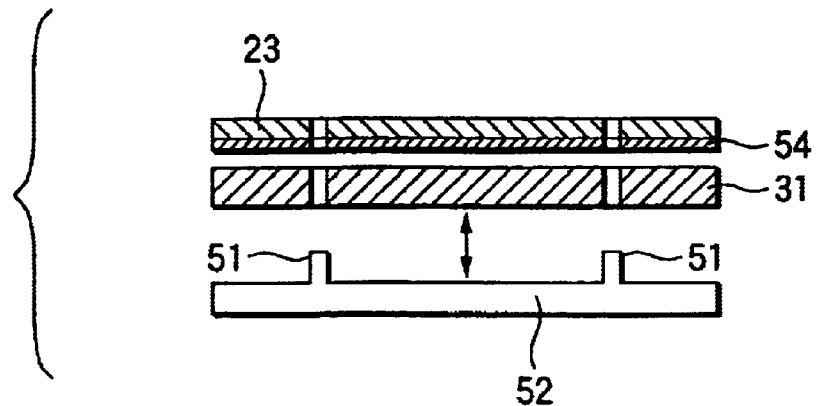
FIG. 5 is a cross-sectional view showing a condition in which the lower casing of the circuit unit of FIG. 1 is used as a transport support plate for the flexible printed circuit.
Figure 6A:
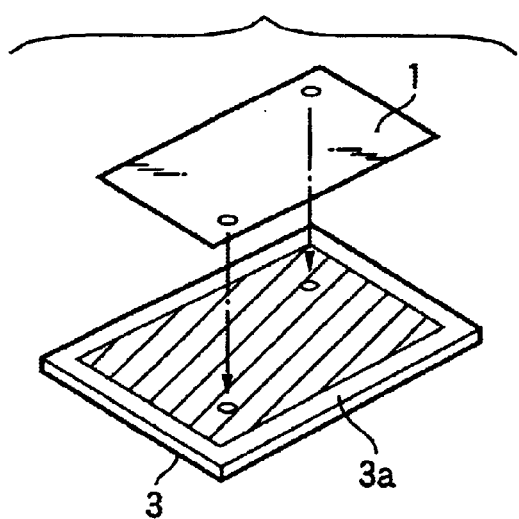
FIGS. 6A to 6E are views explanatory of a process of producing a related circuit unit.
Figure 6B:
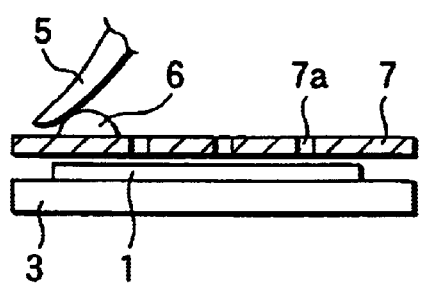
Figure 6C:
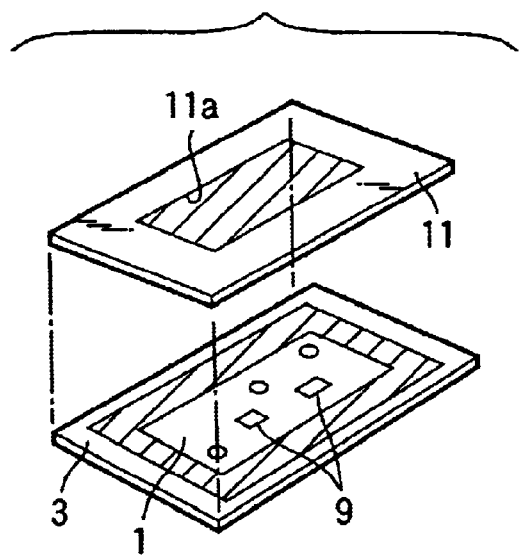
Figure 6D:
Figure 6E:
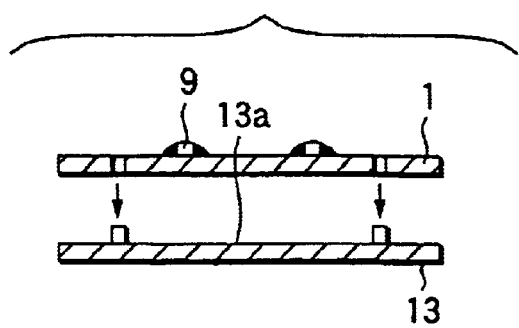

FIGS. 1 to 5 show the preferred embodiment of the circuit unit of the invention as well as the method of producing this circuit unit, and FIG. 1 is an exploded perspective view showing the circuit unit of the invention, FIG. 2 is a cross-sectional view taken along the line II—II of FIG. 1, FIG. 3 is a perspective view of a lower casing as seen from a lower side thereof, FIG. 4 is an exploded perspective view showing the lower casing and an FPC (flexible printed circuit) shown in FIG. 1, and FIG. 5 is a cross-sectional view showing a condition in which the lower casing of the circuit unit of FIG. 1 is used as a transport support plate for the FPC.

The circuit unit 21 in this embodiment is mounted on a door panel of a vehicle or the like, and is used, for example, as a power window circuit unit for electrically opening and closing windows of a vehicle. The circuit unit comprises: an FPC 23 having a wiring circuit printed on a film-like or a sheet-like thin flexible insulative substrate; the lower casing 30 which holds the FPC 23 and includes a bottom wall 31 covering a lower surface of the FPC 23 having electronic parts 25 mounted on an upper surface thereof by soldering and a side wall 32 forming a peripheral edge portion of the bottom wall 31; and an upper casing 40 which includes an upper wall 41 covering an upper surface of the FPC 23, and engagement members 42 through which this upper casing is connected to the lower casing 30.

The lower casing 30 is an integrally-molded product made of an insulative resin having excellent heat-resistance, and its bottom wall 31 on which the FPC 23 is placed has a flat upper surface 31a, and the side wall 32 thereof projects downwardly from the bottom wall 31, as shown in FIG. 3, so that this side wall 32 will not hinder a coating operation in which solder paste is coated to the upper surface of the FPC 23, held on the bottom wall 31, by a squeegee. Reinforcing ribs 33, which increase the rigidity of the upper surface of the bottom wall 31, are formed integrally on a lower surface of the bottom wall 31 as shown in FIG. 3. Retaining projections 34 for connecting the upper casing 40 to the lower casing are formed on longer sides of the side wall 32.

Before the electronic parts 25 are mounted on the upper surface of the FPC 23 by soldering, the FPC 23 is beforehand put in a predetermined position on the bottom wall 31, using a positioning jig 52 having projections 51 passing through the bottom wall 31 of the lower casing 30 and the FPC 23, as shown in FIG. 5, and then the FPC is fixed to the bottom wall 31 by an adhesive double coated tape 54 bonded to the FPC 23.

After the positioning operation, the positioning jig 52 is removed from the lower surface of the bottom wall 31. Then, the lower casing 30 (from which the positioning jig 52 has been removed), to which the FPC 23 is fixed by the adhesive double coated tape 54, is sent to a mounting line for the electronic parts 25 and a soldering line, and this lower casing is used as a transport support plate as mentioned in the background of the invention when mounting the electronic parts by soldering.

More specifically, the lower casing 30 is sent to the mounting line for the electronic parts 25 and the soldering line, and in the same process as described in the background of the invention, solder paste is coated to the FPC 23. Thereafter, this lower casing in the state that the electric parts 25 are attached to the FPC is charged into a solder reflow furnace (not shown), so the electronic parts 25 are mounted.

In this embodiment, the circuit unit 21 is the power window circuit unit, so that a rubber contact 56 (serving as a switch mechanism) including contact conductors 56a is mounted on the FPC 23 having the electronic parts 25 mounted thereon by soldering, as shown in FIG. 2.

A switch key top 58 for pressing the contact conductors 56a of the rubber contact 56 into contact with circuit contacts 23b are mounted on the upper wall 41 of the upper casing 40. The illustrated switch key top 58 is a tumbler switch which is pivotally movable about an axis on the upper wall 41.

In this embodiment, as shown in FIG. 1, the engagement member 42 provided at the upper casing 40 are retaining holes in which the retaining projections 34 formed on the side wall 32 of the lower casing 30 are engageable, respectively, and these retaining holes are formed in a side wall 43 formed on the upper wall 41.

As shown in FIG. 4, a separate input/output cable 60 is connected to an input/output terminal portion 23c of the FPC 23 which is connectable to an external circuit, an apparatus and so on. In this embodiment, the input/output cable 60 is a flexible flat cable having flat circuit conductors covered with an insulating sheath, and piercing terminals 62 are used for connecting this cable to the input/output terminal portion 23c.

Claws of the piercing terminals 62 for passing through the conductors are pressed by a pair of processing jigs 64 and 65 through a connection through hole 35, formed through the lower casing 30, thereby electrically and mechanically connecting the conductors together.

Instead of the above flexible flat cable, an FPC, having a circuit conductor printed thereon, a known ribbon cable or the like can be used as the input/output cable 60.

In the above circuit unit 21 and the method of producing this circuit unit, the upper surface of the lower wall 31 of the lower casing 30 for holding the FPC 23 is made flat so as not to hinder the coating of the solder to the FPC 23, and this lower casing is made of the heat-resistant insulative material. Therefore, the lower casing 30 itself can be used as a transport support plate when mounting the electronic parts 25 on the FPC 23 and when effecting the soldering operation. Therefore, the use of a special-purpose transport support plate is not necessary when mounting the electronic parts 25 on the FPC 23 and when effecting the soldering operation. Therefore, the design and production of such a special-purpose transport support plate are not necessary, and therefore the production cost of the circuit unit 21 can be reduced.

The lower casing 30 itself can be used as the transport support plate for the FPC 23 when mounting the electronic parts 25 and when effecting the soldering operation, and therefore the steps of attaching and detaching the FPC relative to such a special-purpose transfer support plate are eliminated, so that the productivity can be enhanced.

Before the electronic parts 25 are mounted on the FPC 23, the FPC 23 in its excellent flexible condition is put in position on the upper surface of the bottom wall 31 of the lower casing 30. Therefore, the handling ability of the FPC 23 is good, and the close contact of the FPC with the bottom wall 31 of the lower casing 30 can be enhanced. Further, after the soldering of the electronic parts 25, a separating operation and a mounting operation for the FPC 23, which cause a stress to act on the solder joint portions, are not necessary. Therefore, the application of stresses to the solder joint portions by a handling operation during the production process can be reduced.

Therefore, the electrical and mechanical performance of the solder joint portions can be enhanced, and when switches are mounted on the FPC 23, the lowered reliability of the operation of the switches due to the lifting of the FPC 23 is prevented, thereby enhancing the reliability of the operation of the switches.

In this embodiment, the reinforcing ribs 33, which increases the rigidity of the bottom wall 31 of the lower casing 30, are formed on the lower surface of the bottom wall 31. Therefore when the lower casing 30 is used as the transport support plate in the solder reflow step or the like, the upper surface of the lower casing 30 is prevented from being deformed by heat produced in the reflow step or the like, and the lower casing 30 can be suitably used as the transport support plate of high rigidity.

The circuit unit of the present invention is not limited to the type of switch circuit unit in which the switch mechanism is mounted on the upper casing as in the above embodiment. For example, the present invention can be effectively applied to a circuit unit, having no switch mechanism, in so far as an FPC, having electronic parts mounted thereon, is received in upper and lower casings.

In the circuit unit of the invention and the method of producing this circuit unit, the upper surface of the lower wall of the lower casing for holding the FPC is made flat so as not to hinder the coating of the solder to the FPC, and besides this lower casing is made of the heat-resistant insulative material. Therefore, the lower casing itself can be used as a transport support plate when mounting the electronic parts on the FPC and when effecting the soldering operation. Therefore, the use of a special-purpose transport support plate is not necessary when mounting the electronic parts on the FPC and when effecting the soldering operation. Therefore, the design and production of such a special-purpose transport support plate are not necessary, and therefore the production cost of the circuit unit can be reduced.

The lower casing itself can be used as the transport support plate for the FPC when mounting the electronic parts and when effecting the soldering operation, and therefore the steps of attaching and detaching the FPC relative to such a special-purpose transfer support plate are eliminated, so that the productivity can be enhanced.

Before the electronic parts are mounted on the FPC, the FPC in its excellent flexible condition is put in position on the upper surface of the bottom wall of the lower casing, and therefore the handling ability of the FPC is good, and the intimate contact of the FPC with the bottom wall of the lower casing can be enhanced. And besides, after the soldering of the electronic parts, a separating operation and a mounting operation for the FPC, which cause a stress to act on the solder joint portions, are not necessary, and therefore the application of stresses to the solder joint portions by a handling operation during the production process can be reduced.

Therefore, the electrical and mechanical performance of the solder joint portions can be enhanced, and besides when switches are mounted on the FPC, the lowered reliability of the operation of the switches due to the lifting of the FPC is prevented, thereby enhancing the reliability of the operation of the switches.

What is claimed is:

1. A method of manufacturing a circuit unit comprising a flexible printed circuit, a lower casing for holding the flexible printed circuit, and an upper casing, for covering the flexible printed circuit, connectable to the lower casing, the method comprising:

putting and permanently fixing the flexible printed circuit on a predetermined flat position of the lower casing;

mounting an electric part on the flexible printed circuit;

sending the lower casing, mounting the flexible printed circuit with the electric part, to a solder reflow furnace so that the electric part is soldered to the flexible printed circuit; and connecting the upper casing to the lower casing.

2. The method according to claim 1, wherein in the putting and fixing step, a positioning jig positions the flexible printed circuit on the predetermined flat position by passing projections of the positioning jig through the lower casing and the flexible printed circuit.

3. The method according to claim 1, further comprising:

positioning an adhesive between the flexible printed circuit and the lower casing.

4. The method according to claim 1, further comprising:

connecting a cable to the flexible printed circuit.

5. The method according to claim 1, wherein the upper casing is connected to the lower casing after the electronic part is soldered to the flexible printed circuit.

6. A method of manufacturing a circuit unit, the method comprising:

(a) permanently fixing a flexible printed circuit on a first casing;

(b) mounting an electric part on the flexible printed circuit;

(c) sending the fist casing, the flexible printed circuit, and the electric part through a solder reflow furnace so that the electric part is soldered to the flexible printed circuit; and (d) connecting a second casing to the first casing, wherein steps (a) through (c) are performed in sequence.

7. The method according to claim 6, further comprising:

passing projections of a positioning jig through the first casing and the flexible printed circuit.

8. The method according to claim 6, further comprising:

positioning an adhesive between the flexible printed circuit and the first casing.

9. The method according to claim 6, further comprising:

connecting a cable to the flexible printed circuit.

10. The method according to claim 6, wherein steps (c) and (d) are performed in sequence.

* * * * *